(12) United States Patent
Kagiwata

(10) Patent No.: US 6,433,406 B1
(45) Date of Patent: Aug. 13, 2002

(54) SEMICONDUCTOR DEVICE AND MANUFACTURING METHOD OF THE SAME

(75) Inventor: Hiroshi Kagiwata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 09/695,967

(22) Filed: Oct. 26, 2000

(30) Foreign Application Priority Data

Mar. 7, 2000 (JP) ........................................ 2000-062041

(51) Int. Cl.$^7$ .............................................. H01L 29/00
(52) U.S. Cl. ........................................ 257/529; 257/531
(58) Field of Search ................................. 257/529, 531

(56) References Cited

U.S. PATENT DOCUMENTS 5,729,042 A * 3/1998 Lou et al.
6,040,615 A * 3/2000 Nagai et al.
6,320,243 B1 * 11/2001 Jeong et al.

FOREIGN PATENT DOCUMENTS

EP 509631 * 10/1992

OTHER PUBLICATIONS

Patent Abstracts of Japan, Publication No. 07307387, dated Nov. 21, 1995.

* cited by examiner

*Primary Examiner*—Stephen D. Meier
(74) *Attorney, Agent, or Firm*—Armstrong, Westerman & Hattori, LLP

(57) ABSTRACT

A semiconductor device comprises fuse elements formed on an insulating interlayer over a semiconductor substrate. A groove is formed in the insulating interlayer at each space between the fuse elements. A silicon nitride film of a predetermined thickness covers the side and upper surfaces of each fuse element. Since the side and upper surfaces of each fuse element are covered with the silicon nitride film of the same thickness, the film covering the fuse elements has no local weak point. Consequently, when a fuse element is blown out by applying laser beams, it is prevented that the silicon nitride film breaks before the temperature of the fuse element fully rises, and melted fuse element flows out.

5 Claims, 5 Drawing Sheets

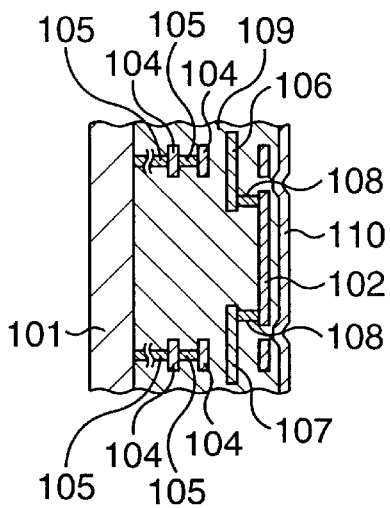
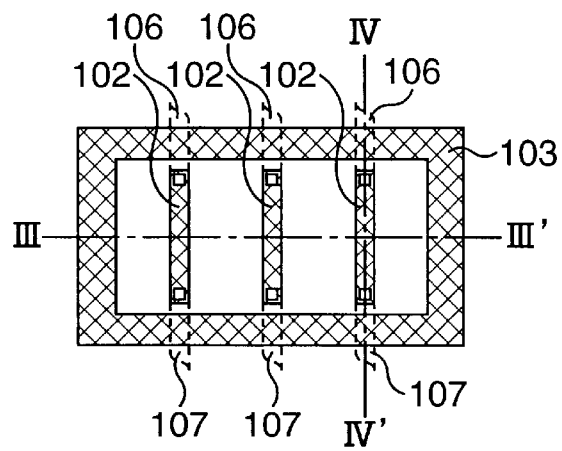
FIG. 1B   FIG. 1A
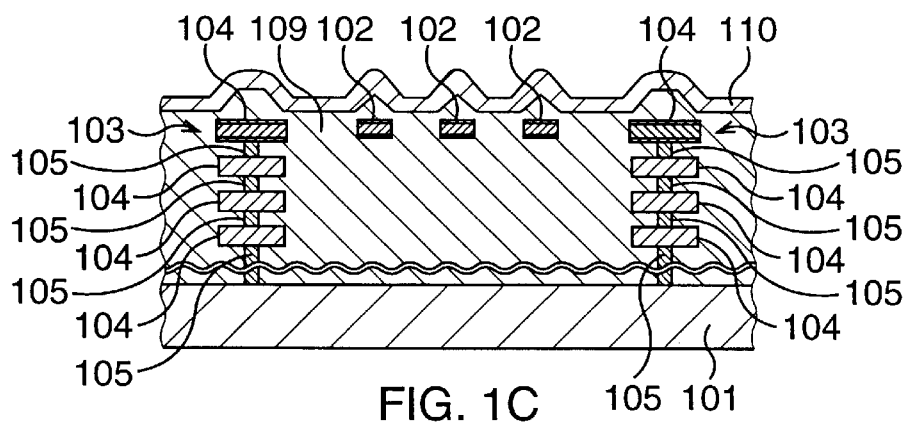
FIG. 1C
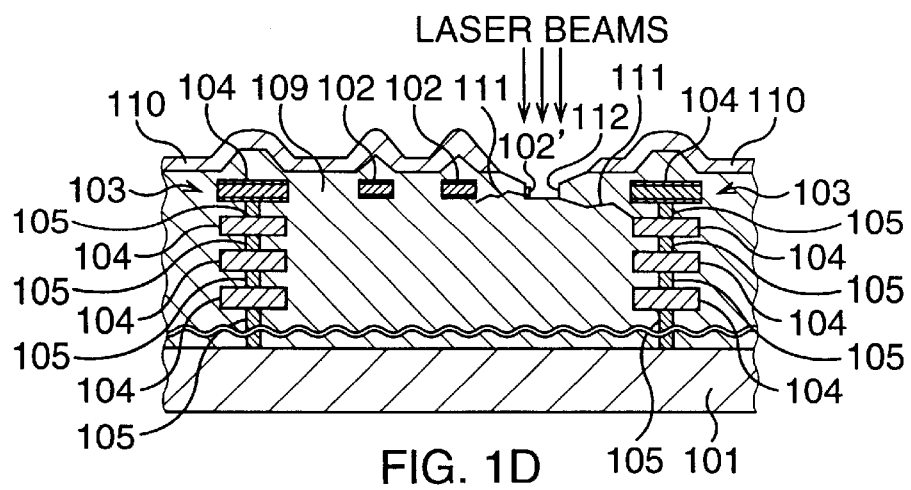
FIG. 1D

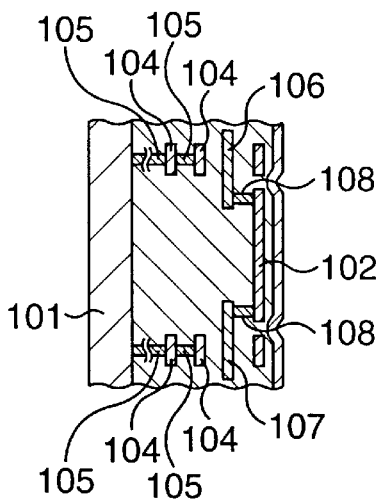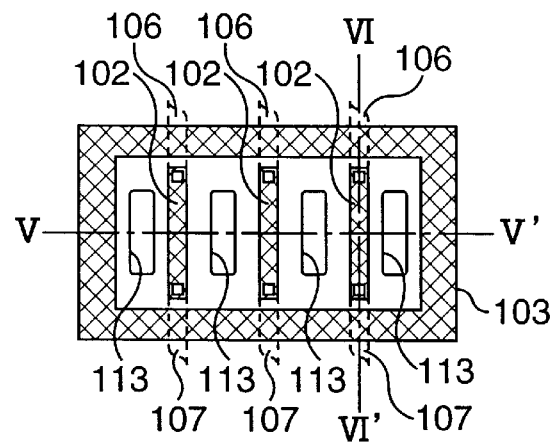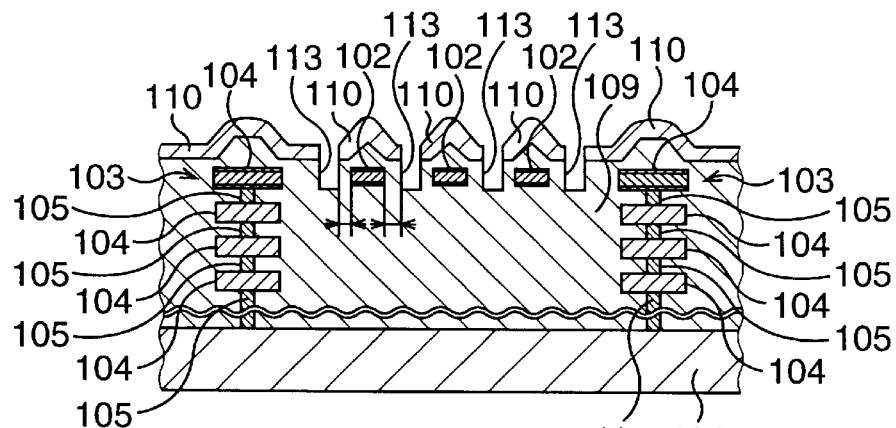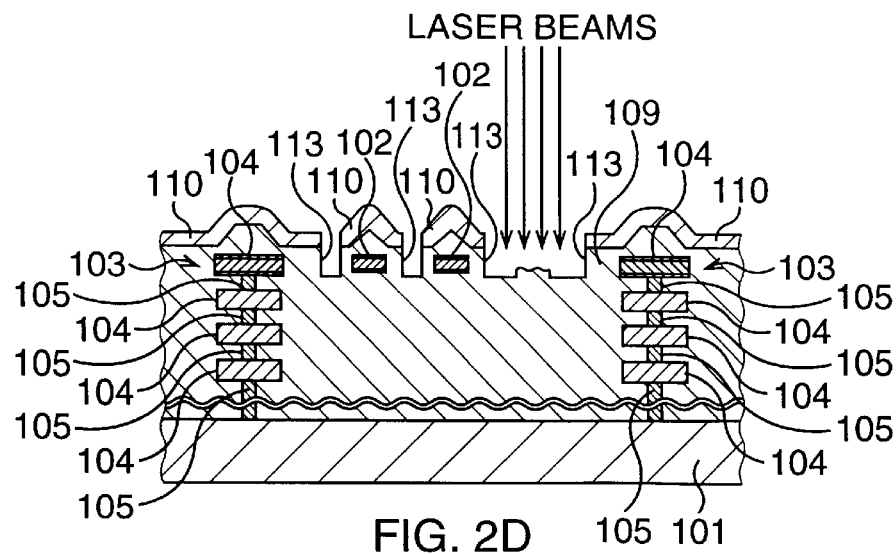

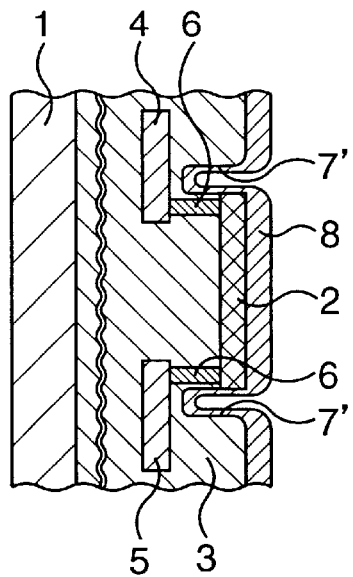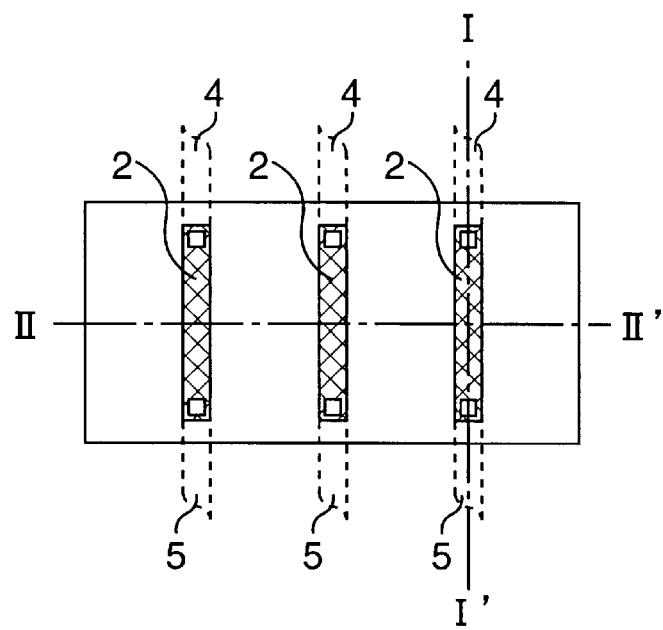
FIG. 3B    FIG. 3A
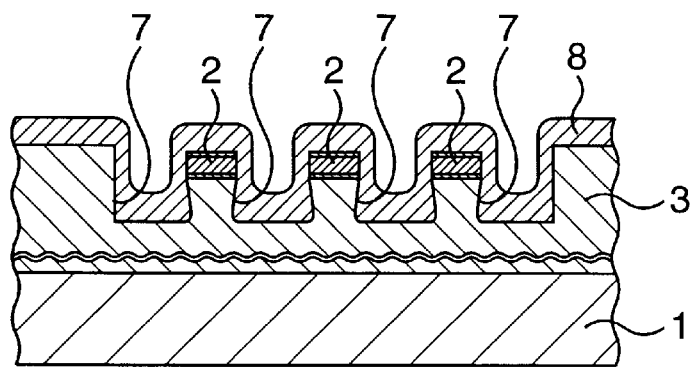
FIG. 3C
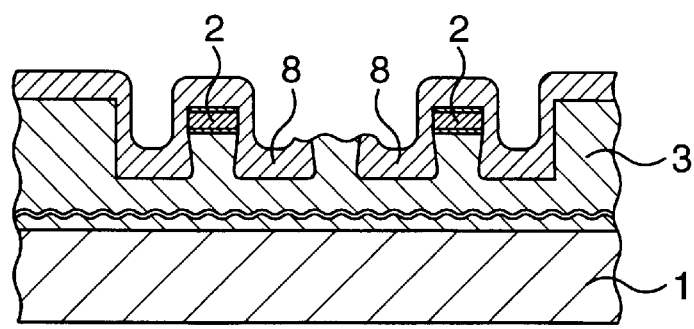
FIG. 3D

SEMICONDUCTOR DEVICE AND MANUFACTURING METHOD OF THE SAME

BACKGROUND OF THE INVENTION

1. Field of the Invention

The present invention relates to semiconductor devices and manufacturing methods of the same, particularly to semiconductor devices provided with fuse elements.

2. Description of the Related Art

Recent semiconductor devices, in particular, memory devices such as dynamic random access memories (DRAMs) are provided with laser fuses (hereinafter, simply referred to as fuses) as switches for replacing defective memory cells with redundancy cells, or as change-over switches for controlling internal levels.

Fuses of various forms are known. But, mostly used is the form that part of usual metal wiring is formed as a fuse in the upper part of the structure on a semiconductor substrate, to be blown out with laser beams.

FIGS. 1A to 1D show a fuse structure mostly used hitherto. FIG. 1A is a plan view showing the disposition of fuse elements formed in the upper part of the structure on a semiconductor substrate 101. FIG. 1B is a schematic sectional view taken along dot-dash line IV–IV' in FIG. 1A. FIGS. 1C and 1D are schematic sectional views taken along dot-dash line III–III' in FIG. 1A. FIGS. 1C and 1D show states before and after a fuse element is blown out with laser beams, respectively.

The conventional fuse structure will be described with reference to FIGS. 1A to 1D. Referring to FIGS. 1A and 1B, fuse elements 102 are disposed in parallel with one another in the upper part of the structure on the semiconductor substrate 101. Each of the fuse elements 102 electrically connects wiring layers 106 and 107 with each other via through-holes 108. The side and upper surfaces of each fuse element 102 are covered with an insulating interlayer 109. As the uppermost layer of the structure on the semiconductor substrate 101, a silicon nitride film 110 is formed on the insulating interlayer 109.

When a fuse element 102 is to be blown out, laser beams are applied to the fuse element 102 from above of the semiconductor substrate 101, to raise the temperature of the fuse element 102. The heated fuse element 102 changes in its state from solid phase to liquid phase and further to gas phase. When the rising pressure attendant upon the change in phase of the fuse element 102 exceeds the mechanical strength of the portion surrounding the fuse element 102, an explosion occurs and the fuse element 102 is blown out. After the blowout, the part of the insulating interlayer 109 which has covered the side and upper surfaces of the fuse element 102, and the corresponding part of the silicon nitride film 110 are blown away to form a recess (crater) 112, as shown in FIG. 1D.

The conventional fuse structure is provided with a moisture-proof ring structure 103 around the fuse elements 102. The ring structure 103 is made up from ring-shaped wiring layers 104 formed at different levels in the structure on the semiconductor substrate 101. All the wiring layers 104 are electrically connected via through-holes 105, and the lowermost wiring layer 104 is electrically connected to the semiconductor substrate 101. When a fuse element 102 is blown out by applying laser beams, a crack 111 may be generated in the insulating interlayer 109 near the blowout portion. The moisture-proof ring structure 103 is for preventing moisture coming through such a crack 111 from spreading beyond the moisture-proof ring structure 103.

However, the conventional fuse structure as shown in FIGS. 1A to 1D has the following problem. When a fuse element 102 is blown out, pieces of the fuse element 102 may adhere to the bottom or side wall of the recess 112, as a result, part 102' of the fuse element 102 may remain. This may cause incomplete blowout of the fuse element 102, and so reduces the reliability of blowout.

Besides, the minute structures of recent semiconductor devices demand to narrow the intervals between fuse elements. But, in case of narrow intervals, the above-described recess 112 may be formed near an adjacent fuse element 102. In this case, when the adjacent fuse element 102 is next blown out, applied laser beams can not sufficiently raise the temperature of the fuse element 102 before explosion because a weak point is present in the portion surrounding the fuse element 102. This also may cause incomplete blowout, and so reduces the reliability of blowout.

Further, the remaining part 102' of the blown-out fuse element 102 as described above may react with moisture, acid, alkali, or the like, to produce aqueous oxide. In this case, electric disconnection at the blowout portion is obtained in a certain time after the blowout occurs. But, when high voltages are repeatedly applied between the wiring layers 106 and 107 on both sides of the blowout portion, the aqueous oxide gradually spreads over the blowout portion finally to make an electric path. This is deterioration of cutoff resistance with age.

Further, high-pressure metal vapor of, e.g., aluminum as the material of fuse elements 102, may enter the above-described crack 111 extending from the bottom of the recess 112, to cause a short circuit with an adjacent fuse element 102 or another wiring layer. Such a crack 111 may cause not only leakage between neighboring fuse elements or undesirable cutoff of an adjacent fuse element, but also a damage to wiring around the fuse elements or corrosion due to entering moisture.

Japanese Patent Application Laid-open No. 7-307387 (1995) discloses a fuse structure in which grooves are provided on both sides of each fuse element. FIGS. 2A to 2D show the fuse structure of this related art in the same fashion as FIGS. 1A to 1D. FIG. 2A is a plan view showing the disposition of fuse elements formed in the upper part of the structure on a semiconductor substrate. FIG. 2B is a schematic sectional view taken along dot-dash line VI–VI' in FIG. 2A. FIGS. 2C and 2D are schematic sectional views taken along dot-dash line V–V' in FIG. 2A. FIGS. 2C and 2D show states before and after a fuse element is blown out with laser beams, respectively. In FIGS. 2A to 2D, the corresponding components to those in FIGS. 1A to 1D are respectively denoted by the same numerical references as those in FIGS. 1A to 1D.

Referring to FIGS. 2A to 2D, a groove 113 is provided on either side of each of parallel fuse elements 102. The other construction is the same as in FIGS. 1A to 1D.

According to the structure of this related art, when a fuse element 102 is blown out with laser beams, a large opening is formed at the blowout portion because of the grooves 113 on both sides of the fuse element 102 as shown in FIG. 2D. This can prevent metal pieces of the blown-out fuse element 102 from adhering to the blowout portion. Besides, unlike the case of FIGS. 1A to 1D, since no recess 112 is formed, such a crack 111 as shown in FIG. 1D is hardly generated.

The grooves 113 of this fuse structure can be formed as follows. A photoresist is formed on the silicon nitride film 110, and processed with a mask into a pattern having openings at the positions respectively corresponding to the grooves 113 to be formed. Anisotropic etching is then performed to the silicon nitride film 110 and the insulating interlayer 109 to form the grooves 113 having their bottoms at a level lower than the bottom level of the fuse elements 102.

In this case, however, unless severe positioning of the grooves 113 to the fuse elements 102 is done, the insulating interlayer 109 may differ in its lateral thickness on both sides of each fuse element 102.

As described above, a fuse element 102 is blown out by the manner that the temperature of the metal material of the fuse element 102 is raised to gasify the material. Since the side and upper surfaces of the fuse element 102 are covered with the insulating interlayer 109, the internal pressure gradually rises with the temperature rising. When the rising pressure exceeds the mechanical strength of the surrounding insulating interlayer 109, an explosion occurs to blow away the gasified metal material with the insulating interlayer 109. The fuse element 102 is thereby blown out.

In this case, if the insulating interlayer 109 differs in its lateral thickness on both sides of the fuse element 102, its mechanical strength also differs on both sides of the fuse element 102. As a result, the thinner side wall of the insulating interlayer 109 breaks before the rising pressure reaches the value necessary for the aimed explosion. The metal material of the fuse element 102 whose temperature has not yet fully risen, is then discharged to the groove 13 on the thinner wall side. At this time, the fuse element 102 has not completely been gasified, and is discharged in liquid phase. Thus the fuse element 102 is not completely blown out.

For forming the grooves 113 such that the insulating interlayer 109 has the same lateral thickness on both sides of each fuse element 102, severe positioning of the grooves 113 to the fuse elements 102 must be done. For this purpose, positioning of the photoresist mask for forming the grooves 113 becomes very troublesome.

Besides, in the fuse structure of this related art, the grooves 113 are formed in the insulating interlayer 109, and part of the insulating interlayer 109 is exposed in each groove 113. Since the insulating interlayer 109, which is made of silicon dioxide in general, is less moisture-proof, moisture may permeate the insulating interlayer 109 through the exposed part.

For this reason, provision of a moisture-proof ring structure 103 made up from wide wiring layers around the fuse elements as described above, is indispensable to this fuse structure. This precludes area reduction of such a fuse structure. In particular, when wiring is made of a less moisture-proof material such as copper, the moisture-proof ring structure 103 itself may be corroded, thus reducing the reliability of moisture-proof performance.

Besides, when the intervals between the fuse elements are narrow for demand of minute structure, it is very hard to form, by etching, the grooves 113 having their bottoms at a level near the bottom level of the fuse elements 102.

SUMMARY OF THE INVENTION

It is an object of the present invention to provide semiconductor devices wherein any fuse element can completely be blown out so as surely to cut off the electric connection, and the reliability of blowout is improved thereby.

It is another object of the present invention to provide semiconductor devices wherein moisture can be prevented from entering through the vicinity of any fuse element, without using any moisture-proof ring structure which has need of a large area.

It is still another object of the present invention to provide manufacturing methods of semiconductor devices by which a groove can surely be formed between fuse elements in a simple process, and minute structures can be realized.

According to an aspect of the present invention, a semiconductor device comprises: a semiconductor substrate; a first insulating layer formed over the semiconductor substrate; fuse elements formed on the first insulating layer; a groove formed in the first insulating layer at each space between the fuse elements, said groove having the same width as the space; and a second insulating layer of substantially uniform thickness which covers the side and upper surfaces of each of the fuse elements and the inner surface of the groove.

The second insulating layer is preferably made of a moisture-proof insulating film such as a silicon nitride film.

Otherwise, the second insulating layer is preferably made of a multilayer film.

The bottom of the groove is preferably at a level lower than the bottom level of the fuse elements.

The groove preferably extends so as to surround the whole periphery of each of the fuse elements.

According to another aspect of the present invention, a manufacturing method of a semiconductor device, comprises: the first step of forming fuse elements of a predetermined shape on a first insulating layer over a semiconductor substrate; the second step of removing a predetermined quantity of the first insulating layer at each space between the fuse elements using the fuse elements as masks to form a groove; and the third step of forming a second insulating layer of a predetermined thickness to cover the side and upper surfaces of each of the fuse elements and the inner surface of the groove.

Preferably in the third step, a moisture-proof insulating film such as a silicon nitride film is formed as the second insulating layer.

Otherwise, a multilayer film may be formed as the second insulating layer.

Preferably in the second step, the groove is so formed as to have its bottom at a level lower than the bottom level of the fuse elements.

Preferably in the second step, a predetermined quantity of the first insulating layer on both sides and at both ends of each of the fuse elements is removed to form a groove surrounding the whole periphery of each of the fuse elements.

According to the present invention, since the insulating layer is formed to have the same thickness on both sides of each fuse element, the same mechanical strength of the insulating layer is obtained on both sides of each fuse element. Therefore, when a fuse element is blown out by applying laser beams, the insulating layer is prevented from breaking first on one side of the fuse element. The fuse element is thereby prevented from flowing out in liquid phase in which the temperature of the fuse element has not yet fully risen. This ensures complete blowout of the fuse element.

In a feature of the present invention, a moisture-proof insulating layer is formed on both sides of each fuse element. Moisture is thereby prevented from entering, without using any moisture-proof ring structure. This affords a reduction of area for fuse structure.

In a feature of the present invention, a groove is formed at each space between the fuse elements using the fuse elements as masks. In this case, any severe positioning process for forming the groove is unnecessary. Without using such a process, a narrow groove can easily be formed. This brings about a minute structure of device.

According to the present invention, any fuse element can stably and surely be blown out. The reliability of blowout is therefore improved. As a result, the reliability of semiconductor devices is improved.

Besides, moisture can be prevented from entering, without using any moisture-proof ring structure which has need of a large area. Accordingly, a reduction of area for fuse structure can be realized.

Besides, a groove can be formed at each space between the fuse elements without severe mask positioning. The groove can surely be formed in a simple process. This can also bring about a minute structure of device.

BRIEF DESCRIPTION OF THE DRAWINGS

FIG. 1A is a plan view showing the fuse structure of a semiconductor device according to a related art;

FIG. 1B is a schematic sectional view taken along dot-dash line IV–IV' in FIG. 1A;

FIGS. 1C and 1D are schematic sectional views taken along dot-dash line III–III' in FIG. 1A;

FIG. 2A is a plan view showing the fuse structure of a semiconductor device according to another related art;

FIG. 2B is a schematic sectional view taken along dot-dash line VI–VI' in FIG. 2A;

FIGS. 2C and 2D are schematic sectional views taken along dot-dash line V–V' in FIG. 2A;

FIG. 3A is a plan view showing the fuse structure of a semiconductor device according to an embodiment of the present invention;

FIG. 3B is a schematic sectional view taken along dot-dash line I–I' in FIG. 3A;

FIGS. 3C and 3D are schematic sectional views taken along dot-dash line II–II' in FIG. 3A;

DETAILED DESCRIPTION OF THE PREFERRED EMBODIMENT

Figure 4A:
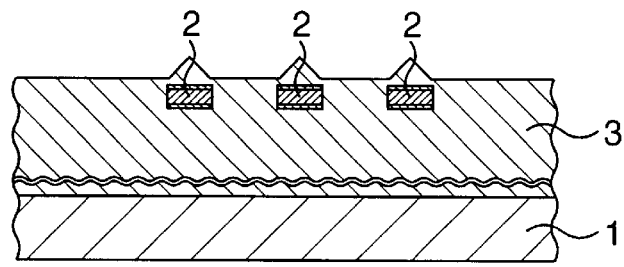
FIGS. 4A to 4D are schematic sectional views showing a manufacturing process of the fuse structure according to the embodiment, in the order of manufacturing steps.

Hereinafter, an embodiment of the present invention will be described with reference to drawings.

FIGS. 3A to 3D show the fuse structure of a semiconductor device according to an embodiment of the present invention. FIG. 3A is a plan view showing the disposition of fuse elements formed in the upper part of the structure on a semiconductor substrate. FIG. 3B is a schematic sectional view taken along dot-dash line I–I' in FIG. 3A. FIGS. 3C and 3D are schematic sectional views taken along dot-dash line II–II' in FIG. 3A. FIGS. 3C and 3D show states before and after a fuse element is blown out with laser beams, respectively. In FIG. 3A, a silicon nitride film 8 is omitted.

Referring to FIGS. 3A to 3C, fuse elements 2 are disposed in parallel with one another on an insulating interlayer 3, i.e., in the upper part of the structure on a semiconductor substrate 1. The fuse elements 2 can be made of a material for usual metal wiring, such as aluminum or copper. Each fuse element 2 is provided with barrier metal films as its upper and lower layers. The barrier metal films can be made of titanium, titanium nitride, or the like. As the insulating interlayer 3, usable are HDP-USG (High-Density Plasma-Undoped Silicate Glass), BPSG (Boro-Phospho Silicate Glass), or the like, which are superior in filling performance and have low dielectric constants. As shown in FIGS. 3A and 3B, each fuse element 2 electrically connects wiring layers 4 and 5, which are formed at a lower level than the fuse element 2, with each other via through-holes 6 filled with a conductive material.

Grooves 7 are formed in the insulating interlayer 3 on both sides of each fuse element 2. Each groove 7 has its bottom at a level lower than the bottom level of the fuse elements 2. The width of the groove 7 between neighboring fuse elements 2 is equal to the interval between the fuse elements 2, so that either of the opposite side surfaces of the fuse elements 2 forms part of the corresponding side wall of the groove 3. In addition, as shown in FIG. 3B, grooves 7' are formed at both ends of each fuse element 2. The bottom level of the grooves 7' is the same as that of the grooves 7. The grooves 7 and 7' communicate with each other.

A silicon nitride film 8 is formed to cover the side and upper surfaces of each fuse element 2, the whole inner surface of each groove 7, and, as shown in FIG. 3B, the whole inner surface of each groove 7'.

Since the bottom level of the grooves 7 is lower than the bottom level of the fuse elements 2, and the width of the groove 7 between neighboring fuse elements 2 is equal to the interval between the fuse elements 2, as described above, all the side surfaces of the fuse elements 2 are covered with the silicon nitride film 8. Since the fuse elements 2 are fully covered with the silicon nitride film 8 superior in moisture-proof performance, moisture can be prevented from entering, without using any moisture-proof ring structure. In addition, since the entire space between neighboring fuse elements 2 is made into a groove 7, any severe positioning process of the grooves 7 to the fuse elements 2 becomes unnecessary.

Besides, the silicon nitride film 8 can have the same lateral thickness on both sides of each fuse element 2. This ensures the same mechanical strength of the silicon nitride film 8 on both sides of each fuse element 2.

The silicon nitride film 8 is thus formed in the same lateral thickness on both sides of each fuse element 2. Therefore, when laser beams are applied to a fuse element 2, the silicon nitride film 8 surrounding the fuse element 2 is prevented from breaking before the temperature of the fuse element 2 fully rises. That is, the fuse element 2 is prevented from flowing out in liquid phase through the broken part of the silicon nitride film 8. Consequently, the fuse element 2 can be fully heated with laser beams, and the internal pressure can be fully raised to a value necessary for an aimed explosion. This brings about sure blowout of the fuse element 2.

FIG. 3D is a sectional view showing a state after a fuse element 2 is blown out with laser beams. In this example, the middle one of three fuse elements 2 shown in FIG. 3C has been blown out. As the temperature of the fuse element 2 is raised by applied laser beams, the internal pressure of the silicon nitride film 8 rises. When the rising pressure exceeds the mechanical strength of the silicon nitride film 8, an explosion occurs. The silicon nitride film 8 which has surrounded the fuse element 2 is thereby blown away, and the fuse element 2 is blown out. In this process, since the silicon nitride film 8 has the same thickness on both sides of the fuse element 2, the silicon nitride film 8 is prevented from breaking in a state that the pressure is not so high. Thus the temperature of the fuse element 2 can be fully raised and the fuse element 2 can surely be blown out.

Besides, since grooves 7 are provided in the insulating interlayer 3 on both sides of the fuse element 2, and grooves 7' are provided in the insulating interlayer 3 at both ends of the fuse element 2, such a recess 112 as shown in FIG. 1D is not formed after the explosion (see FIG. 3D). The fuse element 2 is thereby prevented from partially remaining after blowout. Thus prevented is formation of an electric path between the wiring layers 4 and 5.

Besides, generation of a crack in the insulating interlayer 3 after explosion is also prevented.

Next, a manufacturing process of the fuse structure shown in FIGS. 3A to 3D will be described with reference to FIGS. 4A to 4D. FIGS. 4A to 4D are schematic sectional views showing the manufacturing process in the order of manufacturing steps.

Referring first to FIG. 4A, the lower part of an insulating interlayer 3 is formed over a semiconductor substrate 1. Wiring layers including fuse elements 2 are then formed on the lower part of the insulating interlayer 3. After this, the upper part of the insulating interlayer 3 is formed to embed the wiring layers.

Figure 4B:
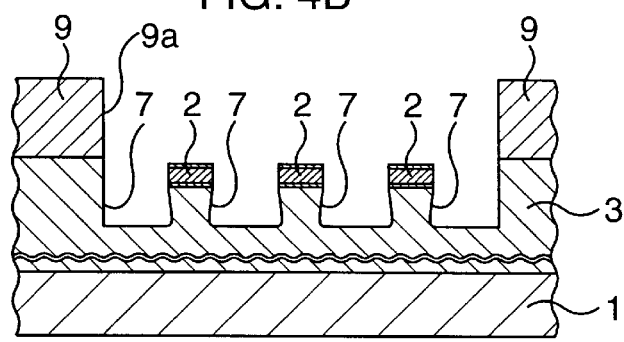

Referring next to FIG. 4B, a photoresist 9 having an opening 9a at a predetermined area wherein the fuse elements 2 are formed, is formed by photolithography. Anisotropic etching is then performed at an etching rate aimed at the insulating interlayer 3, using the photoresist 9 as a mask. In this etching process, each fuse element 2 serves as an etching mask in the opening 9a. As a result, only the portions of the insulating interlayer 3 where the fuse elements 2 do not exist, are etched to a deep level to form grooves 7. In this case, etching time is controlled such that the bottom of each groove 7 is formed at a level lower than the bottom level of the fuse elements 2.

Simultaneously with the grooves 7, grooves 7' are formed in the insulating interlayer 3 at both ends of each fuse element 2, as shown in FIG. 3B. By provision of the grooves 7' at both ends of each fuse element 2, prevented is generation of a crack from the vicinity of each groove 7' at the time of blowout of the fuse element 2.

Figure 4C:
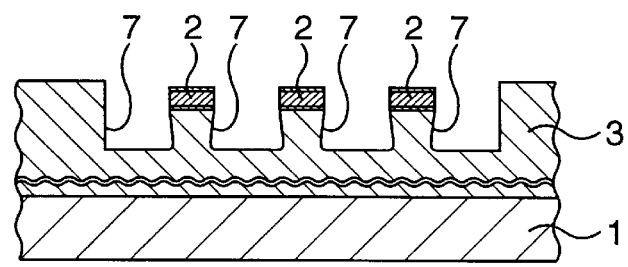

Referring next to FIG. 4C, the photoresist 9 is removed from the insulating interlayer 3 by ashing process or the like.

Figure 4D:
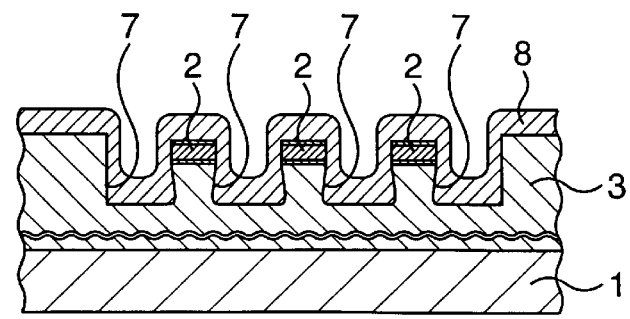

Referring next to FIG. 4D, a silicon nitride film 8 is formed on the entire surface of the structure on the semiconductor substrate 1 to cover the side and upper surfaces of each fuse element 2. At this time, the whole inner surface of each of the grooves 7 and 7' is also covered with the silicon nitride film 8. The fuse structure as shown in FIGS. 3A to 3D is formed thus. The mechanical strength of the silicon nitride film 8 covering the fuse elements 2 can freely be controlled by changing the thickness of the silicon nitride film 8. Therefore, the mechanical strength for blowing out a fuse element 2 can arbitrarily be set.

As described above, according to the embodiment of the present invention, the portions of the insulating interlayer 3 where the fuse elements 2 do not exist, are etched to form the grooves 7. The silicon nitride film 8 is then made to grow on the side and upper surfaces of each fuse element 2. The side and upper surfaces of each fuse element 2 are covered with the silicon nitride film 8 of the same thickness. Prevented is a local reduction of the mechanical strength of the film covering the fuse elements 2. Consequently, when a fuse element 2 is blown out by applying laser beams, it is prevented that the silicon nitride film 8 breaks before the temperature of the fuse element 2 fully rises, and melted fuse element 2 flows out.

Besides, since grooves 7 are provided in the insulating interlayer 3 on both sides of each fuse element 2, such a recess (crater) as shown in FIG. 1D is not formed in the insulating interlayer 3 after a fuse element 2 is blown out. Thus, part of the blown-out fuse element 2 is prevented from remaining to form an electric path between the wiring layers 4 and 5. In addition, since such a recess is not formed in the insulating interlayer 3, generation of a crack which may extend toward the lower layer, can be prevented.

Therefore, by applying laser beams, a fuse element 2 can surely be blown out. The reliability of blowout is thus improved.

Further, each fuse element 2 and the insulating interlayer 3 under it are completely covered with the silicon nitride film 8 superior in moisture-proof performance, moisture is prevented from permeating the insulating interlayer 3. Thus, such a moisture-proof ring structure surrounding the fuse elements as in the related arts becomes unnecessary. This brings about a reduction of area for fuse structure, simplification of manufacturing process, and a reduction of cost. Besides, according to the embodiment, since each groove 7 can be wider than each groove 113 shown in FIGS. 2A to 2D, the grooves 7 deeper than the bottom level of the fuse elements 2 can easily be formed.

(Modification)

Figure 5:
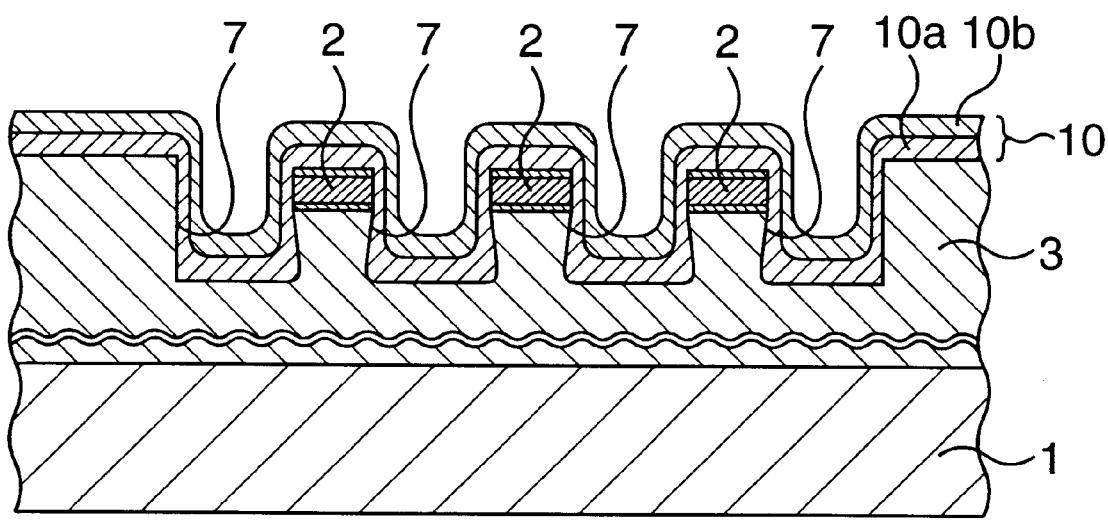
FIG. 5 is a schematic sectional view showing a fuse structure according to a modification of the embodiment.

A modification of the above embodiment will be described below with reference to FIG. 5. FIG. 5 shows a schematic sectional view corresponding to FIG. 3C. In this modification, the components other than the film covering the fuse elements 2 are the same as those in FIGS. 3A to 3D.

Referring to FIG. 5, in this modification, a multilayer film 10 comprising two layers is used for covering the side and upper surfaces of each fuse element 2, in place of the silicon nitride film 8. The multilayer film 10 comprises, e.g., a silicon dioxide layer 10a and a silicon nitride layer 10b. In this case, the silicon dioxide layer 10a directly covers each fuse element 2 and the silicon nitride layer 10b is formed on the silicon dioxide layer 10a. The multilayer film 10 may comprise three or more layers.

In this manner, the silicon nitride layer 10b does not directly cover each fuse element 2, and the silicon dioxide layer 10a is interposed between them.

This prevents generation of stress between the silicon nitride layer 10b and each fuse element 2.

In this modification, by properly selecting the component layers of the multilayer film 10, any desired mechanical strength on both sides of each fuse element 2 can be obtained.

Although the invention has been described in its preferred form with a certain degree of particularity, it is understood that various changes, modifications, and alternations can be made in the invention without departing from the spirit and the scope thereof.

What is claimed is:

1. A semiconductor device comprising:

a semiconductor substrate;

a first insulating layer formed over said semiconductor substrate;

fuse elements formed on said first insulating layer;

a groove formed in said first insulating layer at each space between said fuse elements, said groove having the same width as said space; and a second insulating layer of substantially uniform thickness which covers the side and upper surfaces of each of said fuse elements and the inner surface of said groove.

2. A semiconductor device as set forth in claim 1, wherein said second insulating layer is made of a moisture-proof insulating film such as a silicon nitride film.

3. A semiconductor device as set forth in claim 1, wherein said second insulating layer is made of a multilayer film.

4. A semiconductor device as set forth in claim 1, wherein the bottom of said groove is at a level lower than the bottom level of said fuse elements.

5. A semiconductor device as set forth in claim 1, wherein said groove extends so as to surround the whole periphery of each of said fuse elements.

* * * * *